United States Patent
Park et al.

(10) Patent No.: US 10,627,932 B2
(45) Date of Patent: Apr. 21, 2020

(54) TRANSPARENT CONDUCTIVE LAYER, METHOD FOR MANUFACTURING THE SAME AND DISPLAY DEVICE INCLUDING THE SAME

(71) Applicant: LG DISPLAY CO., LTD., Seoul (KR)

(72) Inventors: Jaehyun Park, Seoul (KR); JinWuk Kim, Goyang-si (KR); Wy-Yong Kim, Seoul (KR); HyeLi Min, Bucheon-si (KR); MinJee Kim, Seoul (KR); Youngsub Shin, Goyang-si (KR); Keunsoo Jeong, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 273 days.

(21) Appl. No.: 14/753,715

(22) Filed: Jun. 29, 2015

(65) Prior Publication Data
US 2015/0378489 A1 Dec. 31, 2015

(30) Foreign Application Priority Data

Jun. 30, 2014 (KR) ........................ 10-2014-0081276
Dec. 16, 2014 (KR) ........................ 10-2014-0181849

(51) Int. Cl.
| | | |
|---|---|---|
| *H01L 51/00* | (2006.01) | |
| *H01L 51/50* | (2006.01) | |
| *G06F 3/041* | (2006.01) | |
| *G02B 1/16* | (2015.01) | |
| *G02F 1/1343* | (2006.01) | |

(Continued)

(52) U.S. Cl.
CPC ............ *G06F 3/0412* (2013.01); *G02B 1/16* (2015.01); *G02F 1/13439* (2013.01); *G06F 3/044* (2013.01); *H01L 51/0021* (2013.01); *H01L 51/5215* (2013.01); *H01L 51/5234* (2013.01); *B82Y 20/00* (2013.01); *H01L 2251/301* (2013.01); *H01L 2251/305* (2013.01); *H01L 2251/5338* (2013.01)

(58) Field of Classification Search
CPC ..... H01L 51/00; H01L 51/0021; H01L 51/50; H01L 51/5234
USPC ................ 977/762; 428/357, 364, 401, 402; 174/250, 255, 257, 258, 110 R, 68.1; 345/174; 257/749, 787–789
See application file for complete search history.

(56) References Cited

U.S. PATENT DOCUMENTS

| | | | |
|---|---|---|---|
| 2005/0017260 A1 | 1/2005 | Lee | |
| 2006/0044299 A1* | 3/2006 | Wang | ...................... G09G 3/006 345/207 |

(Continued)

FOREIGN PATENT DOCUMENTS

| | | |
|---|---|---|
| KR | 1020130104867 A | 9/2013 |
| WO | 2007022226 A2 | 2/2007 |
| WO | 2013192437 A2 | 12/2013 |

OTHER PUBLICATIONS

Extended European Search Report dated Nov. 27, 2015 in European Patent Application No. 15174597.3 (8 pages).

*Primary Examiner* — Matthew D Matzek
(74) *Attorney, Agent, or Firm* — Dentons US LLP

(57) ABSTRACT

Disclosed is a display device having a transparent conductive layer that includes a plurality of nanowires, wherein each nanowire may, for example, include a core that includes a metal; a first shell on the core; and a second shell on the first shell, wherein cores of at least two of the plurality of nanowires are in contact with each other through the first shell and the second shell.

14 Claims, 17 Drawing Sheets

(51) Int. Cl.
*G06F 3/044* (2006.01)
*H01L 51/52* (2006.01)
*B82Y 20/00* (2011.01)

(56) References Cited

U.S. PATENT DOCUMENTS

| | | | |
|---|---|---|---|
| 2007/0074316 A1* | 3/2007 | Alden | B82Y 20/00 257/784 |
| 2007/0128439 A1* | 6/2007 | Kim | B01J 13/02 428/404 |
| 2009/0188697 A1 | 7/2009 | Guiheen et al. | |
| 2012/0061124 A1* | 3/2012 | Cui | B82Y 20/00 174/128.1 |
| 2015/0321220 A1* | 11/2015 | Mishima | F26B 21/004 428/292.1 |

* cited by examiner

200 °C 30 min

200 °C 30 min

200 °C 180 min

TRANSPARENT CONDUCTIVE LAYER, METHOD FOR MANUFACTURING THE SAME AND DISPLAY DEVICE INCLUDING THE SAME

This application claims the benefit of Korean Patent Application No. 10-2014-0081276 filed on Jun. 30, 2014 and Korean Patent Application No. 10-2014-0181849 filed on Dec. 16, 2014, all of which are hereby incorporated by reference for all purposes as if fully set forth herein.

BACKGROUND OF THE INVENTION

Field of the Invention

The present invention relates to a display device and a method of manufacturing the same, and more particularly, to a display device that has a transparent conductive layer including a plurality of nanowires.

Discussion of the Related Art

Transparent conductive layers have been extensively used for various types of display devices such as plasma display panels (PDPs), organic light emitting devices, liquid crystal displays (LCDs), solar cells, touch devices, and the like. With the rapid growth of display and solar battery industries, demand for transparent conductive layers has been sharply increased. Indium tin oxide (ITO) has largely been used as a material for such transparent conductive layers.

ITO can be used to form a transparent conductive layer under process conditions appropriate for glass substrates. However, when ITO is formed on a plastic substrate by sputtering, the flexibility of the transparent conductive layer may not be sufficient. Thus, ITO may not be an appropriate material for such a transparent conductive layer on a flexible substrate. Also, indium included in ITO is a rare metal, which is contained by about 10 to 20 ppm when zinc (Zn) or lead (Pb) is mined. Indium reserves are believed to be about 6000 tones, which is expected to be depleted around 2018.

Recently, metal nanowires have been developed to form a transparent conductive layer as a substitute of ITO. Silver, gold, and platinum are typical metals that can be used for such metal nanowires. Among these metal nanowires, silver nanowires have become predominant due to cost issues. However, forming a transparent conductive layer using silver nanowires typically requires a patterning process using a photolithography system. Due to the characteristics of the photolithography system, when a surface of an underlying film is uneven, it may be difficult to stack the next film on top, which in turn may generate a mura and moiré and degrade the visual characteristics of the display device.

SUMMARY OF THE INVENTION

Accordingly, the present invention is directed to a display device having a transparent conductive layer and method for manufacturing the same that substantially obviate one or more of the problems due to limitations and disadvantages of the related art.

An advantage of the present invention is to provide a display device having a transparent conductive layer that can be formed by a simplified manufacturing process.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a display device having a transparent conductive layer that includes a plurality of nanowires, wherein each nanowire may, for example, include a core that includes a metal; a first shell on the core; and a second shell on the first shell, wherein cores of at least two of the plurality of nanowires are in contact with each other through the first shell and the second shell.

In another aspect of the present invention, a transparent conductive layer may, for example, include electrically insulating nanowires, each nanowire has a core composed of a conductive material, an electrically insulating shell on the core, wherein the transparent conductive layer comprises at least a conductive region comprising weld joints between adjacent nanowires.

In yet another aspect of the present invention, a method of manufacturing a display device including forming a transparent conductive pattern, the forming the transparent conductive pattern may, for example, include applying a metal nanowire dispersion solution on a substrate; heating the substrate on which the metal nanowire dispersion solution is applied to form a metal nanowire layer; and irradiating a light onto the metal nanowire layer to form the transparent conductive pattern, wherein the transparent conductive pattern includes a plurality of nanowires, each nanowire including a core that includes a metal, a first insulating shell on the core and a second shell on the first shell.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Reference will now be made in detail to embodiments of the present invention, examples of which are illustrated in the accompanying drawings. The same reference numbers may be used throughout the drawings to refer to the same or like parts.

Figure 1:
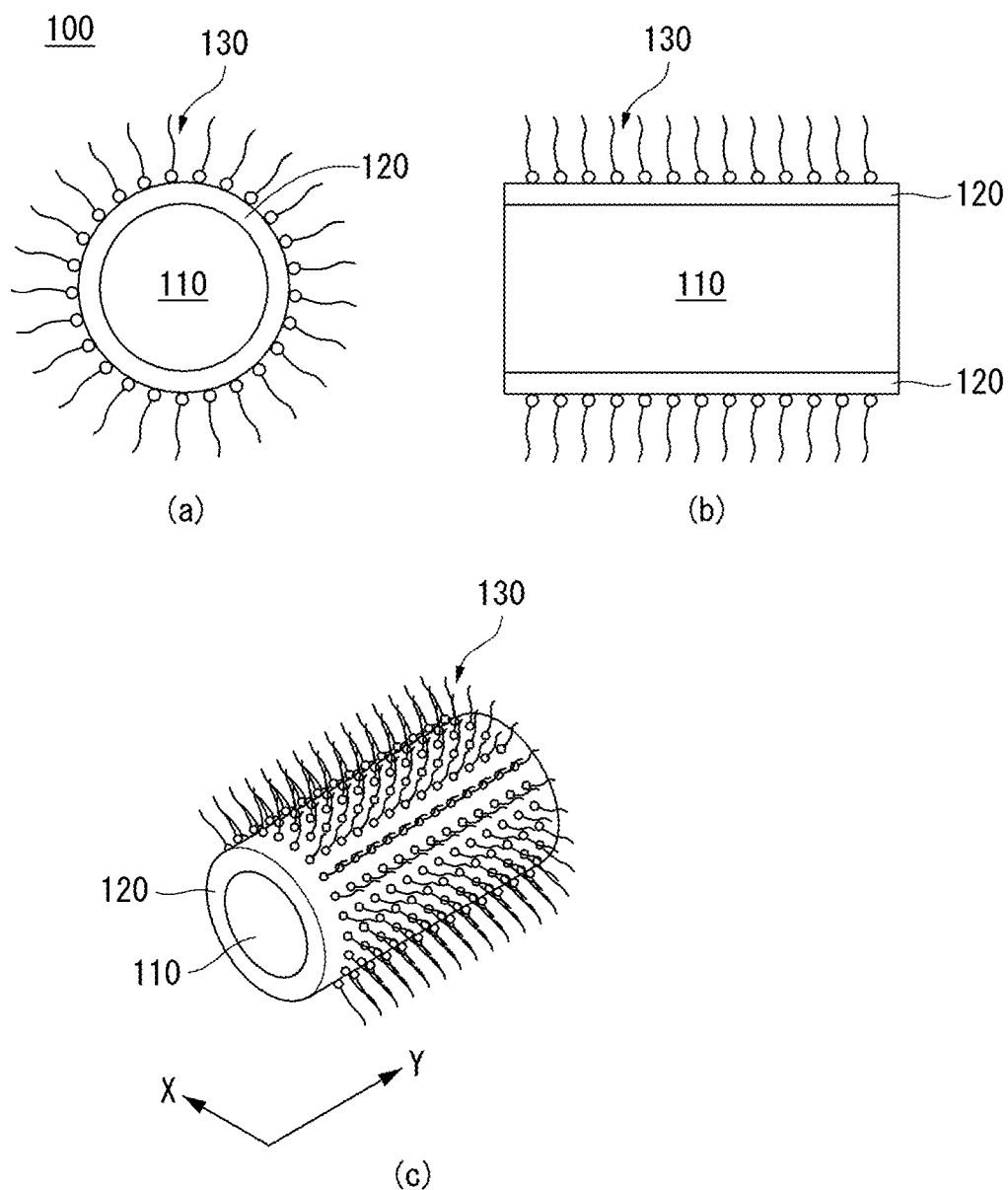
FIG. 1 are cross-sectional, side-sectional and perspective views illustrating a nanowire according to an embodiment of the present invention.
Figure 2:
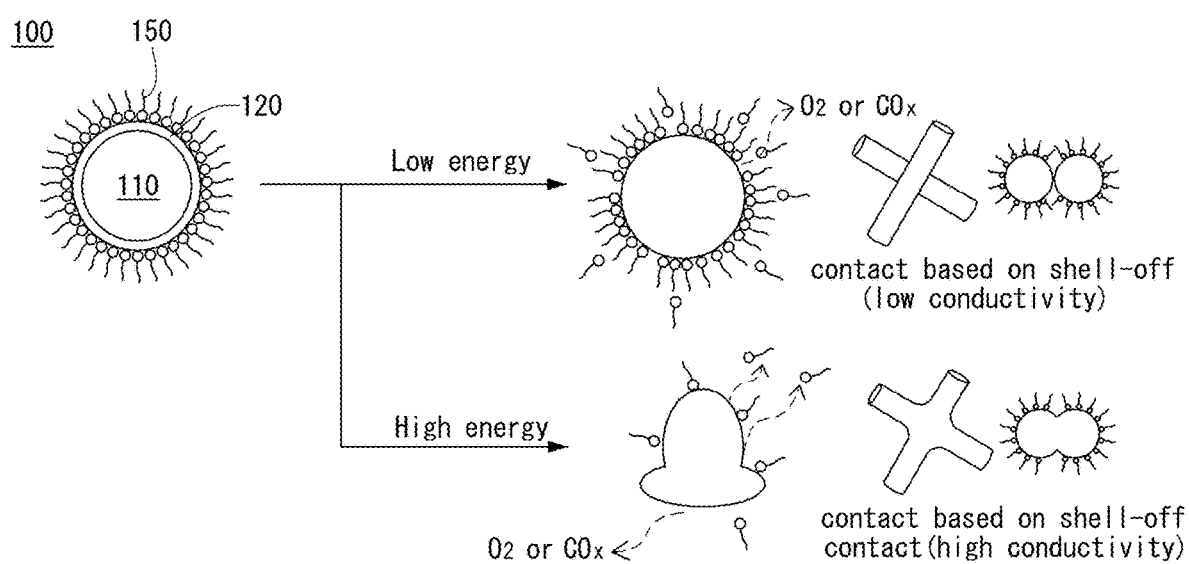
FIG. 2 is a schematic view illustrating a structural change in a nanowire according to an embodiment of the present invention.

FIG. 1 are cross-sectional, side-sectional and perspective views illustrating a nanowire according to an embodiment of the present invention, and FIG. 2 is a schematic view illustrating a structural change in a nanowire according to an embodiment of the present invention.

Referring to FIG. 1, a nanowire 100 according to an embodiment of the present invention includes a core 110, a first shell 120, and a second shell 130. The core 110 is formed of copper (Cu) in the nanowire 100. Copper is a material which has high conductivity and is low in price. In particular, copper has a surface plasmon resonance (SPR) characteristic that can be advantageously controlled with light irradiated thereto. However, the material for the core 110 according to the present invention is not limited to copper, and various other materials, which beneficially have a surface plasmon resonance characteristic, can be used.

The first shell 120 is formed of a metal oxide (MeOx) that is a metal oxide of the core 110. For example, when the core 110 is formed of copper, the first shell 120 is formed of a copper oxide. The first shell 120 is an insulating layer to control a conductivity of the core 110.

The second shell 130 is formed of an amine-based surfactant. The second shell 130 serves as a reducing agent for preventing or reducing additional oxidation of the copper core 110, as well as serving as an insulating layer. The amine-based surfactant may have, for example, an $NH_2$—R form (R is an alkyl chain, 6 to 18 carbon atoms) or may include a dual bond therebetween. Insulating properties may be adjusted according to a length and a structure of the amine-based carbon chain, and oxidation characteristics may also be controlled simultaneously.

A nanowire 100 according to another embodiment of the present invention may include a core 110, a first shell 120, and a second shell 130, and here, the core 110 is formed of silver (Ag). Due to the presence of silver (Ag), the nanowire 100 may have excellent electrical characteristics and high transmittance even with a small concentration of silver. Silver is a material having SPR, similar to or the same as that of copper, and thus, characteristics of silver can be advantageously controlled with irradiated light. The first shell 120 is formed of polyvinylpyrrolidone (PVP). The first shell 120 serves as an insulating layer to control a conductivity of the core 110 through a thickness thereof, and contributes to the formation of the nanowire.

The second shell 130 is formed of a surfactant having a carbon chain, and here, for example, silane-based, an amine-based, an acid-based, or a ketone-based surfactant may be used. Preferably, the second shell 130 may be formed of a silane-based surfactant. The silane-based surfactant may be one or more selected from the group including glycidoxypropyltriethoxysilane, 3-glycidoxypropyltrimethoxysilane, N-(2-aminoethyl)-3-aminopropylmethyldimethoxysilane, N-(2-aminoethyl)-3-aminopropyltrimethoxysilane, $(H_2N(CH_2)_2NH(CH_2)_3Si(OCH_3)_3)$, N-(2-aminoethyl)-3-aminopropyltriethoxysilane, 3-aminopropyltrimethoxysilane, 3-aminopropyltriethoxysilane, 3-triethoxysili-N-(1,3-dimethylbutylidene)propylamine, N-phenyl-3-aminopropyltrimethoxysilane, 3-mercaptopropylmethyldimethoxysilane, 3-mercaptopropyltriethoxysilane, and 3-isocyanatepropyltriethoxysilane.

The second shell 130 serves as an insulating layer. In particular, the silane-based surfactant serves as an insulating layer between two wires that are in contact with each other, regardless of the distance between the two wires. Also, the silane-based surfactant may improve heat resistance characteristics that can reduce or prevent a disconnection of the nanowire due to an excessive heat generated by the irradiated light and ensure smooth welding. Thus, unlike the silver nanowire according to the related art, the silver nanowire according to an embodiment of the present invention has very high insulating properties.

When the silver nanowires are coated and light is irradiated thereto, heat is locally generated in regions where the wires cross each other due to SPR. The shell(s) may be adjusted according to an amount of heat generated. The silver nanowire according to an embodiment of the present invention may increase contact resistance and enhance heat resistance characteristics, while reducing or minimizing a thickness of the first shell 120 (PVP), so that a disconnection of the silver nanowire may be reduced or prevented.

According to an embodiment of the present invention, a length of the nanowire in a shorter axis direction (X) is equal to or smaller than 500 nm, and the nanowire has an aspect ratio (length of the longer axis (Y):length of the shorter axis (X)) ranging from 10 to 10000.

When the aspect ratio of the nanowire is too large, it may be difficult to handle the nanowire, and thus, the aspect ratio of the nanowire may beneficially be equal to or smaller than 10000. A length of the nanowire in the shorter axis direction (X) beneficially ranges from 1 nm to 500 nm, thereby reducing or preventing degradation of transmittance that may occur when the length of the nanowire in the shorter axis direction (X) is too large, and thereby reducing or preventing a problem of having difficulty in synthesizing the nanowire that may occur when the length of the nanowire in the shorter axis direction (X) is too small. Also, a length of the nanowire in the longer axis direction (Y) beneficially ranges from 1 µm to 100 µm, thereby reducing or preventing degradation of conductivity that may occur when the length of the nanowire in the longer axis direction (Y) is too small, and thereby reducing or preventing a problem of having difficulty in handling the nanowire that may occur when the length of the nanowire is too large in the longer axis direction (Y).

Also, the nanowire according to an embodiment of the present invention is formed as a linear nanowire. The linear nanowire refers to a straight nanowire without being furcated. However, the nanowire according to an embodiment of the present invention is not limited thereto, and it may have a small number of branches or may be curved at a small angle. The nanowire may be synthesized according to known methods. For example, the nanowire according to an embodiment of the present invention may be formed through a reduction method or by applying a voltage or current to a precursor.

The foregoing nanowires are dispersed in a solvent so as to be easily formed on a substrate. As for the solvent, octadecene having a boiling point equal to or higher than 250° C. as a hydrophobic solvent or a polar solvent such as water may be used. Also, a colorless monomer, olygomer, or polymer as a binder may be used in an amount of 0.01 to 10 parts by weight over the nanowire in order to enhance coating characteristics. In addition, an additive such as a dispersing agent, a surfactant, and the like, may be further added to the solvent with the nanowires dispersed therein such that the nanowires may be easily coated with an appropriate dispersion force on the substrate.

Referring to FIG. 2, when the nanowire 100 is coated and light is irradiated thereto, heat is locally generated in regions where the wires cross each other due to SPR, and the presence of the shell(s) may be adjusted according to a degree of the generated heat. Here, light ranging from ultraviolet light to infrared light may be used for SPR. In the portion in which the wires cross each other, a wire positioned in an upper portion serves as an antenna and performs transmission to a lower wire, and SPR generated between the wires is amplified and strengthened in the crossings. An amount of amplification may be adjusted according to levels of energy (low energy or high energy) of the irradiated light during this process. Thus, in a region to which light of a low energy is irradiated, the shells of the wires are partially removed and the crossing wires become partially in contact with each other, leading to a low conductivity. On the other hand, in a region to which light of a high energy is irradiated, the shells of the wires are removed and surfaces of the crossing wires are melted and welded together, leading to a high conductivity.

In the copper nanowire according to an embodiment of the present invention, the generated heat causes a reduction of the first shell (copper oxide), with the second shell acting as a reducing agent. Due to the reduction, the copper oxide is reduced to a copper metal and the first shell is thus removed, which increases the conductivity and clearly demarcates a conductive region and a nonconductive region. Optical characteristics of the silver nanowire according to the related art may change due to a change in shape, but those of the copper nanowire according to an embodiment of the present invention are being substantially maintained.

Also, in the silver nanowire according to an embodiment of the present invention, the presence of the first shell (PVP) may be adjusted according to an amount of the generated heat. That is, the first shell can be removed by the generated heat, which increases the conductivity and clearly demarcates the conductive region and the non-conductive region. In particular, the silver nanowire according to an embodiment of the present invention has a high contact resistance and enhances heat resistance characteristics, while a thickness the first shell (PVP) can be reduced or minimized, so that a disconnection of the silver nanowire may be reduced or prevented.

Hereinafter, a method for manufacturing a transparent conductive layer including a nanowire according to an embodiment of the present invention will be described. In this case, a copper nanowire will be described as an example.

Figure 3:
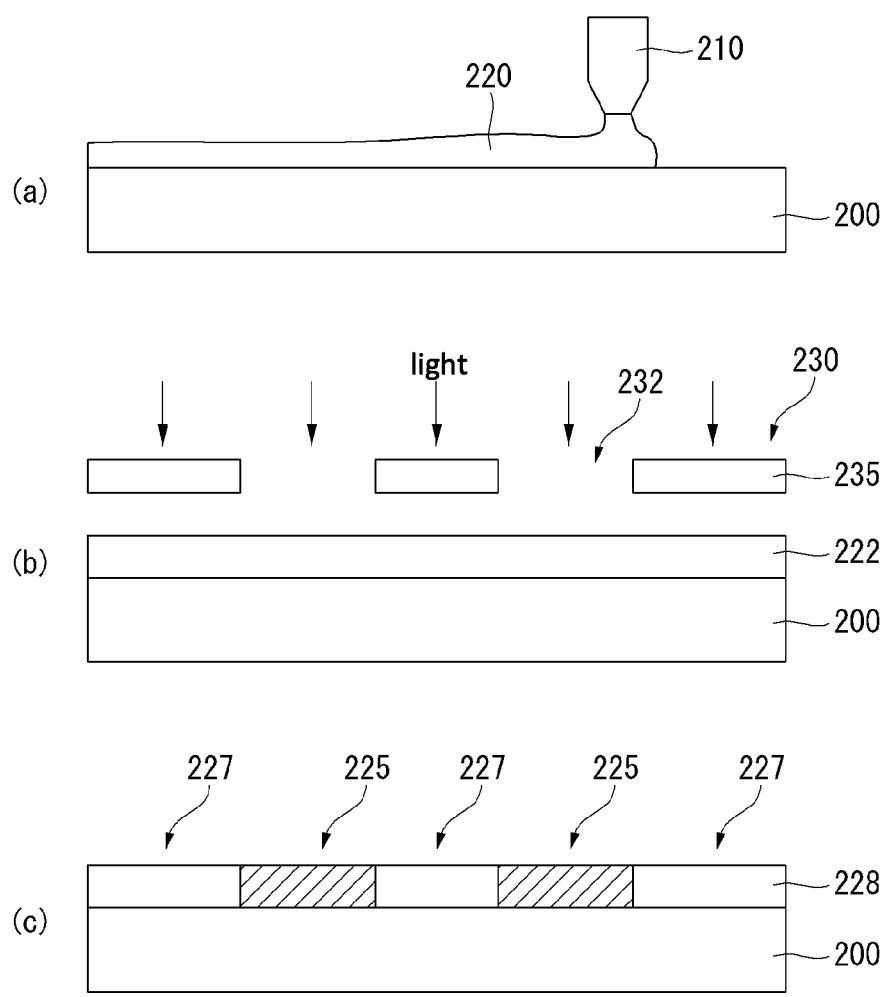
FIG. 3 is a view illustrating sequential processes of a method for manufacturing a transparent conductive layer according to an embodiment of the present invention.
Figure 4A:
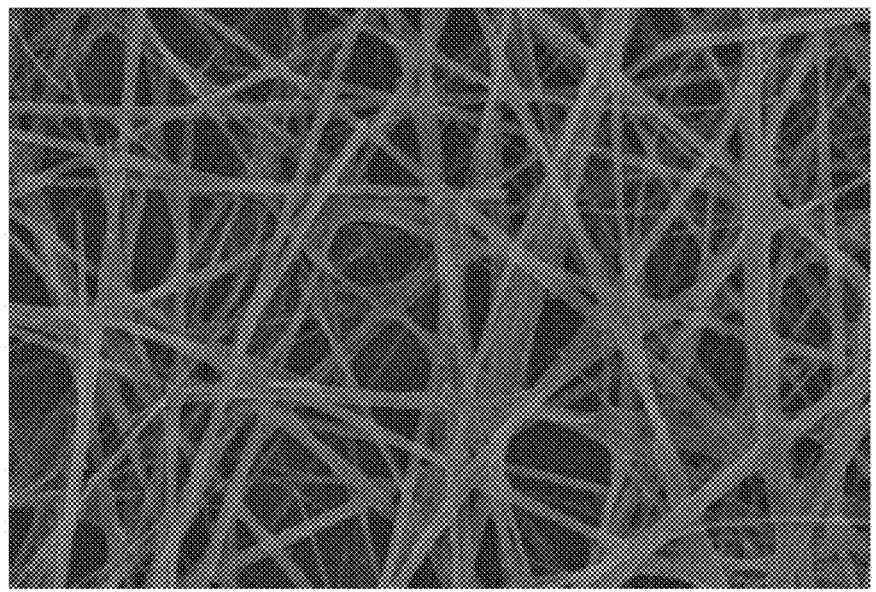
FIGS. 4A through 4D are scanning electron microscope (SEM) images of a copper nanowire manufactured according to Embodiment 1 of the present invention.
Figure 4B:
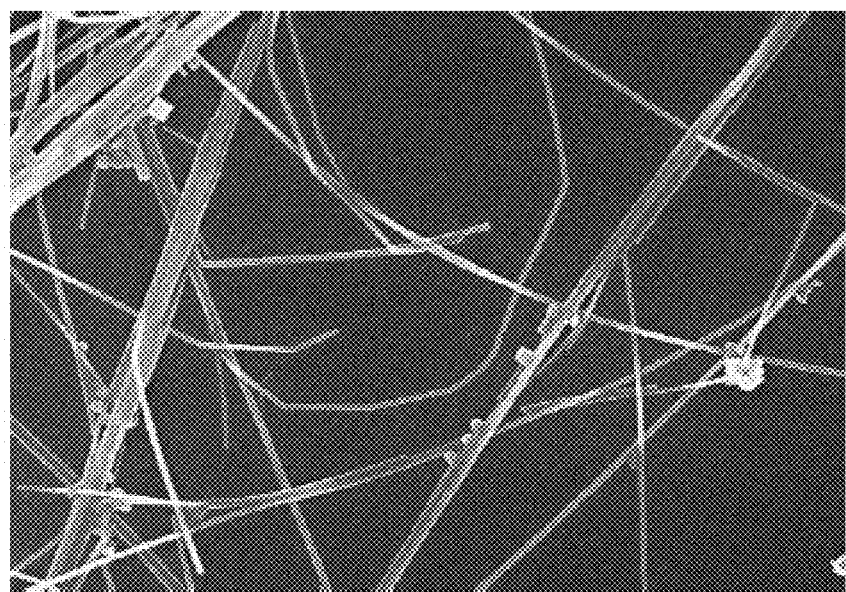
Figure 4C:
Figure 4D:
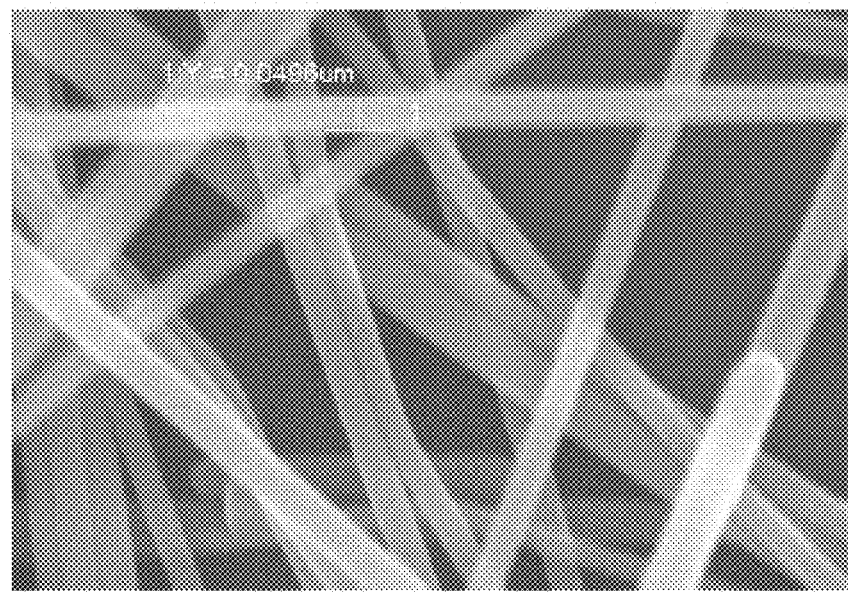

FIG. 3 is a view illustrating sequential processes of a method for manufacturing a transparent conductive layer according to an embodiment of the present invention.

Referring to (a) of FIG. 3, a substrate 200 on which a transparent conductive layer is to be formed is prepared. The substrate 200 may be formed of various materials such as a resin film, a glass substrate, a metal substrate, and the like. When the substrate 200 is prepared, the copper nanowire dispersion solution described above is prepared. In this embodiment, a copper precursor and a nickel precursor are put into a flask, impurities are removed, and nanowires are formed at a temperature of about 200° C. As the copper precursor, a salt type precursor such as copper chloride, copper acetate, copper nitrate, or copper acetylacetonate may be used. As the nickel precursor, a salt type precursor such as nickel chloride, nickel acetate, nickel nitrate, or nickel acetylacetonate may be used. Here, a ratio of copper and nickel is beneficially 2:1. When the ratio of copper decreases or the ratio of nickel increases, a length of the wire is reduced. Conversely, when the ratio of copper increases or the ratio of nickel decreases, a length of the wire is increased.

The temperature is lowered to room temperature, a cleaning is performed using a hexane, and it is left for 2 to 3 days. A binder is mixed with the solution to prepare a copper nanowire dispersion solution. An additive such as a dispersing agent or surfactant may be added to the copper nanowire dispersion solution. Thereafter, the prepared copper nanowire dispersion solution is put to a bar coater and applied to the substrate 200 through a bar coating method. Here, as a method for applying the copper nanowire dispersion solution, a general solution application method such as a spin coating method or the like may be used, in addition to the bar coating method. The substrate 200 to which the copper nanowire dispersion solution has been applied is heated to remove the solvent.

Thereafter, referring to (b) of FIG. 3, a mask 230 including a transmission portion 232 and a blocking portion 235 is disposed on a coating layer 222 formed by the copper nanowire dispersion solution. Here, the transmission portion 232 is disposed to correspond to a portion of the coating layer 222 in which a conductive region is to be formed, and the blocking portion 235 is disposed to correspond to a portion of the coating layer 222 in which a non-conductive region is to be formed. Subsequently, a light in an infrared region is irradiated to the substrate 200. A range of irradiating light energy is higher than 30 J/cm$^2$, preferably 35~100 J/cm$^2$. Accordingly, a partial amount of light is irradiated to the substrate 200 through the transmission portion 232 of the mask 230, and a partial amount of light is blocked by the blocking portion 235 of the mask 230, rather than being irradiated to the substrate 200.

Referring to (c) of FIG. 3, a transparent conductive layer 228, in which the region to which light has been irradiated, is then formed as a conductive region 225. The region to which light has not been irradiated is formed as a non-conductive region 227 is formed.

In the light-irradiated conductive region 225, the shells of the wires are removed and surfaces of the wires are melted and welded together, leading to a very high conductivity, which can be controlled by various factors such as the energy density of the irradiated light and the materials and thicknesses of the core and the shell(s). Meanwhile, in the non-conductive region 227 to which light has not been irradiated, most of the shells of the wires are not removed, leading to insulating properties. In the non-conductive region 227, some of the shells may be removed with the crossing wires being in contact with each other, leading to a very low conductivity. As a result, the transparent conductive film having the conductive region and the non-conductive region is formed without performing a physical patterning process, which can be used for manufacturing a display device in which the conductive region can be used as an electrode or a wiring.

Hereinafter, various embodiments of the present invention will be described. These embodiments are merely described to illustrate the principles of the present invention, but the present invention is not limited thereto.

Experiment 1: Synthesis of Copper Nanowire

Embodiment 1

0.5 mmol of CuCl2 and 0.2 mmol of Ni acetylacetonate were put into a three neck distillation flask and 10 ml of oleylamine was introduced thereto. A temperature measurement instrument and an atmosphere adjustment (vacuum and nitrogen atmosphere) and heating device were installed in the flask with the solution put therein, and a vacuum atmosphere was produced at a temperature of 80° C., impurities were removed and the solution was stabilized. After about one hour, the vacuum atmosphere was changed into a nitrogen atmosphere and the temperature was increased to 200° C. With the increased temperature maintained for about 24 hours, nanowires were formed. After the reaction was finished, the temperature was lowered to room temperature and a cleaning was performed at 10,000 rpm three times using hexane. In addition, another cleaning was performed at 10,000 rpm using hexane and acetone, precipitates were dispersed in hexane and left three days to synthesize copper nanowires.

Figure 5:
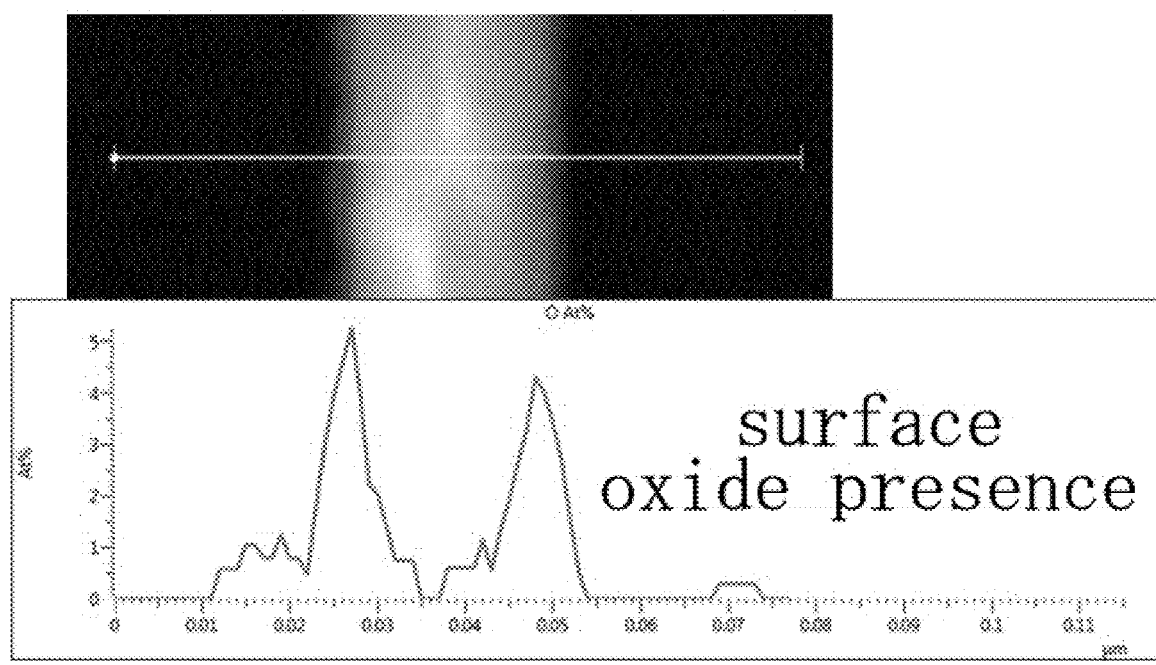
FIG. 5 is transmission electron microscope image of a copper nanowire manufactured according to Embodiment 1 of the present invention.

The copper nanowires manufactured according to Embodiment 1 described above were measured with SEM and TEM. The results of the SEM measurement are illustrated in FIGS. 4A through 4D, and the results of the TEM measurement are illustrated in FIG. 5.

As shown in FIGS. 4A through 4D, copper wires having a length equal to or greater than 22 μm and a width equal to or greater than 0.04 μm were synthesized. Also, as shown in FIG. 5, a copper oxide is present on a surface of the copper core.

Experiment 2: Measurement of Sheet Resistance and Transmittance According to an Amount of Light Irradiated to Copper Nanowire Coating Film Embodiment 2

The copper nanowire dispersion solution prepared according to Embodiment 1 described above was applied to a substrate to form a coating film.

Comparative Example 1

A silver nanowire dispersion solution including silver nanowires including a silver (Ag) core and a PVP shell is applied to a substrate to form a coating film.

Light was irradiated to the coating film manufactured according to Embodiment 1 and Comparative Example 1. Sheet resistances according to an amount of irradiated light were measured and shown in the following Table 1 and in FIG. 6, and transmittances according to an amount of the irradiated light were measured and shown in the following Table 2 and in FIG. 7. Also, images of the nanowires according to an amount of light irradiated to the coating film manufactured according to Comparative Example 1 were illustrated in FIGS. 8A through 8C, and images of the nanowires according to an amount of light irradiated to the coating film manufactured according to Embodiment 2 were illustrated in FIGS. 9A through 9C.

TABLE 1

| | Sheet Resistance ($\Omega/\square$) | |
|---|---|---|
| Light energy ($J/cm^2$) | Comparative Example 1 | Embodiment 2 |
| 0 | 1843 | ∞ |
| 11.5 | 1843 | ∞ |
| 28.25 | 13.42 | 34,407 |
| 30.75 | 8.485 | 3,814 |
| 33.25 | ∞ | 241 |
| 35.75 | ∞ | 50.45 |
| 38.25 | ∞ | 4.75 |
| 40.75 | ∞ | 0.726 |

TABLE 2

| | Transmittance (%) | |
|---|---|---|
| Light energy ($J/cm^2$) | Comparative Example 1 | Embodiment 2 |
| 0 | 90% | 90% |
| 11.5 | 90% | 89% |
| 28.25 | 83% | 91% |
| 30.75 | 80% | 91% |
| 33.25 | 72% | 90% |
| 35.75 | 72% | 89% |
| 38.25 | 72% | 90% |
| 40.75 | 72% | 90% |

Figure 6:
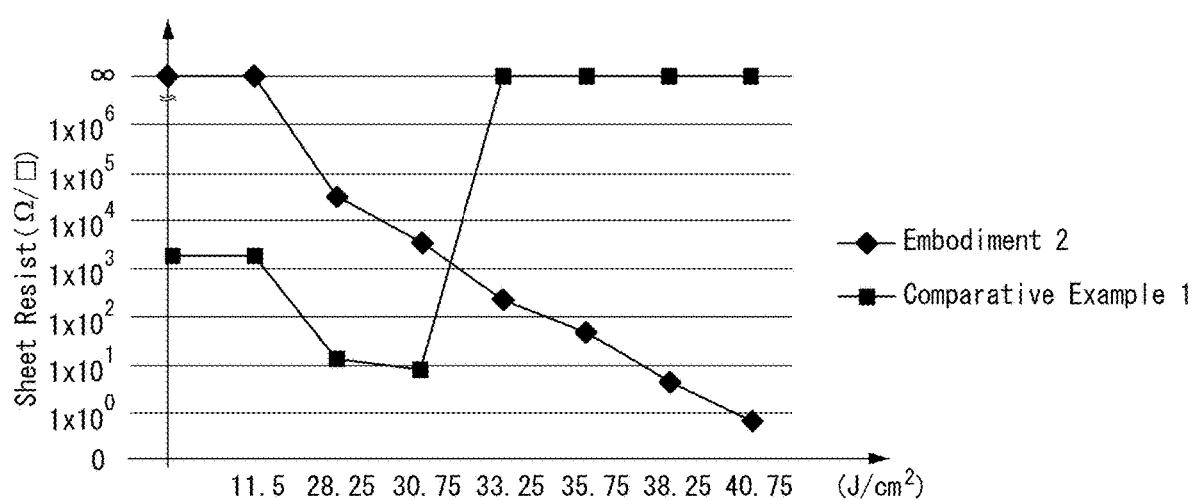
FIG. 6 is a graph showing sheet resistance over an amount of light irradiated to coating films manufactured according to Embodiment 2 and Comparative Example 1 of the present invention.

As shown in Table 1 and FIG. 6, the coating film manufactured according to Embodiment 2 of the present invention has a sheet resistance that decreases as an amount of light irradiated thereto increases, while the coating film manufactured according to Comparative Example 1 has a sheet resistance that rather increases as an amount of light irradiated thereto increases. Thus, the coating film manufactured according to Embodiment 2 of the present invention has the conductivity that increases as the amount of light irradiated thereto increases.

Figure 7:
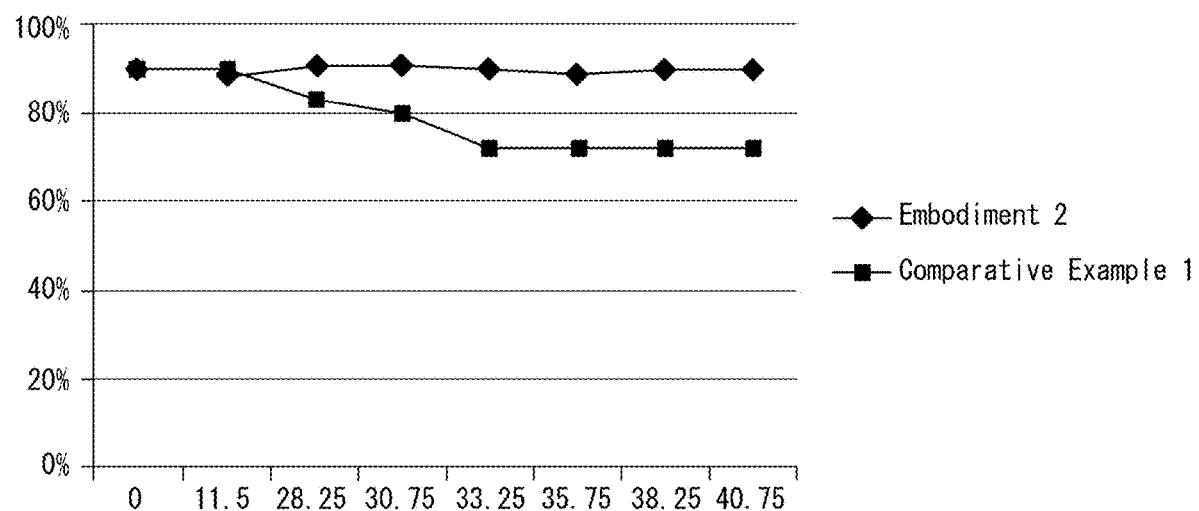
FIG. 7 is a graph showing transmittance over an amount of light irradiated to coating films manufactured according to Embodiment 2 and Comparative Example 1 of the present invention.

Also, as shown in Table 2 and FIG. 7, the coating film manufactured according to Embodiment 2 of the present invention has a uniform transmittance although an amount of light irradiated thereto is increased, while the coating film manufactured according to Comparative Example 1 has a transmittance that is decreased to about 70% when an amount of light irradiated thereto is increased, and the transmittance is then maintained at the level.

Figure 8A:
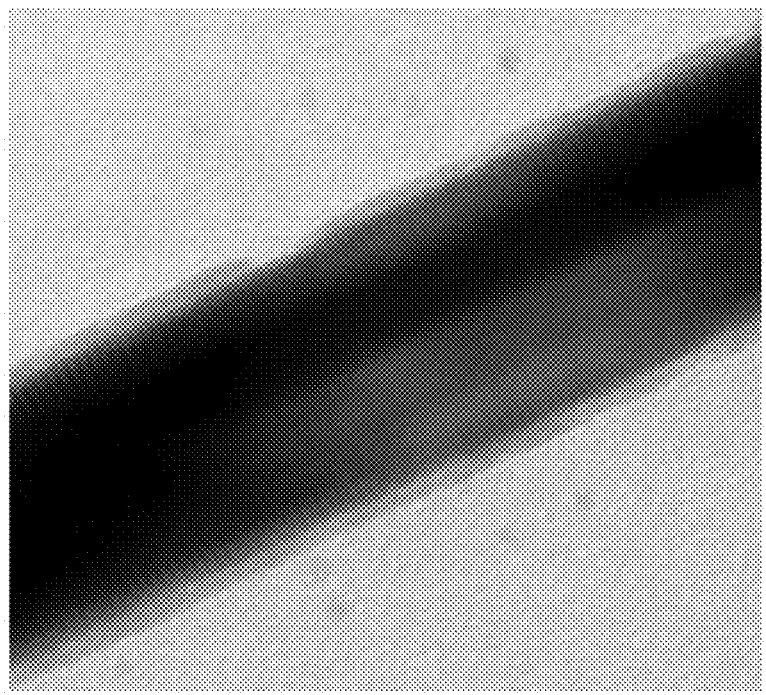
FIGS. 8A through 8C are images of nanowires according to an amount of light irradiated to a coating film manufactured according to Comparative Example 1 in the present invention.
Figure 8B:
Figure 8C:
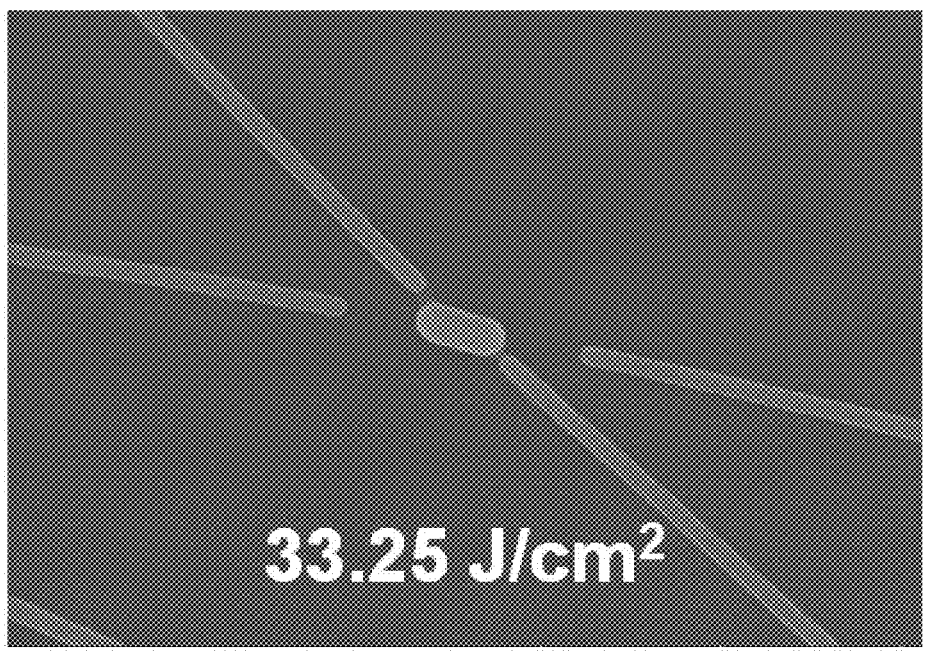
Figure 9A:
FIGS. 9A through 9C are images of nanowires according to an amount of light irradiated to a coating film manufactured according to Embodiment 2 of the present invention.
Figure 9B:
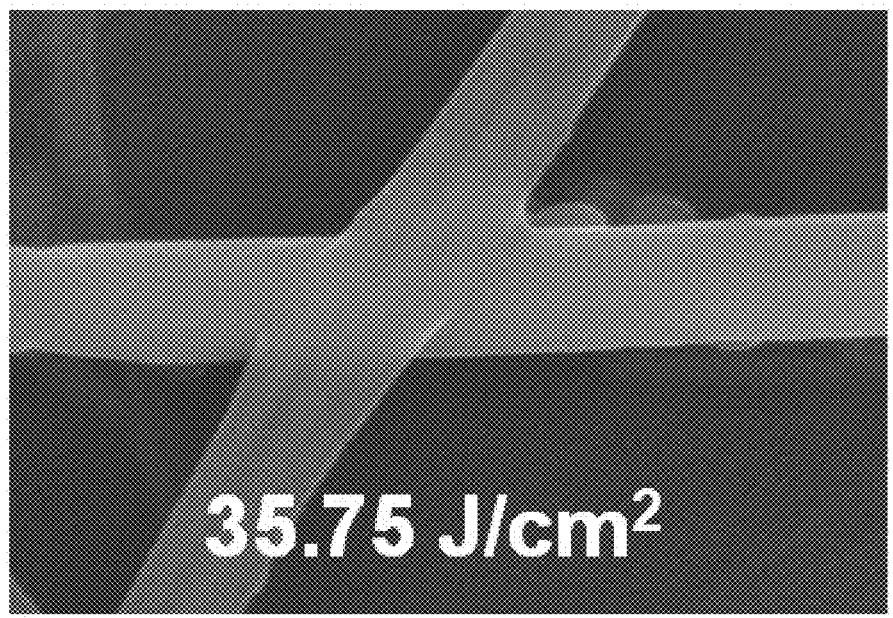
Figure 9C:
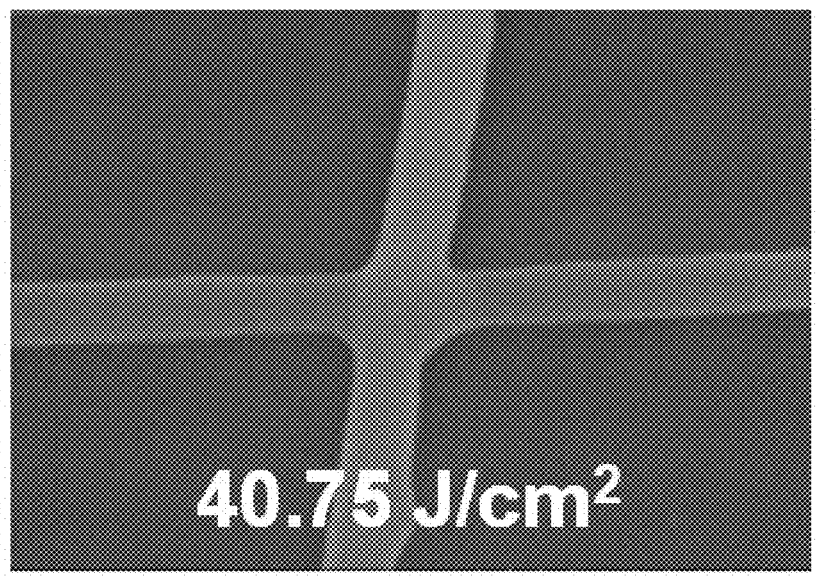

Also, as shown in FIGS. 8A through 8C, a bond of the nanowire of the coating film manufactured according to Comparative Example 1 was broken when an amount of irradiated light was 33.25 J/cm². In contrast, as shown in FIGS. 9A through 9C, the nanowires of the coating film manufactured according to Embodiment 2 come into contact with each other when an amount of irradiated light was 35.75 J/cm², and the nanowires were welded and combined when an amount of irradiated light was 40.75 J/cm².

Experiment 3: Measurement of Conductivity According to the Content of Copper Nanowire and an Amount of Light Irradiated to Copper Nanowire Embodiment 3

0.1 wt % of copper nanowire manufactured according to Embodiment 1 described above, 98.5 wt % of Hexane as solvent, and 1.4 wt % of Oleylamine as other organic substances were mixed to prepare a copper nanowire dispersion solution. The copper nanowire dispersion solution was applied to a substrate to form a coating film.

Embodiment 4

1 wt % of copper nanowire, 98 wt % of Hexane as solvent, and 1 wt % of Oleylamine as organic substance were mixed under the same process conditions as those of Embodiment 3 described above, to form a coating film.

Embodiment 5

0.01 wt % of copper nanowire, 98.99 wt % of Hexane as solvent, and 1 wt % of Oleylamine as organic substance were mixed under the same process conditions as those of Embodiment 3 described above, to form a coating film.

Light was irradiated to the coating films formed according to Embodiments 3 to 5 described above, and sheet resistances according to an amount of irradiated light were measured and shown in the following Table 3 and in FIG. 10.

TABLE 3

| Light energy | Sheet Resistance (Ω/□) | | |
|---|---|---|---|
| (J/cm²) | Embodiment 3 | Embodiment 4 | Embodiment 5 |
| 0 | ∞ | ∞ | ∞ |
| 11.5 | ∞ | ∞ | ∞ |
| 28.25 | 34,407 | 9,843 | 751,354 |
| 30.75 | 3,814 | 721 | 54,985 |
| 33.25 | 241 | 27.45 | 6134 |
| 35.75 | 50.45 | 3.42 | 721 |
| 38.25 | 4.75 | 0.97 | 82.43 |
| 40.75 | 0.726 | 0.43 | 9.87 |

Figure 10:
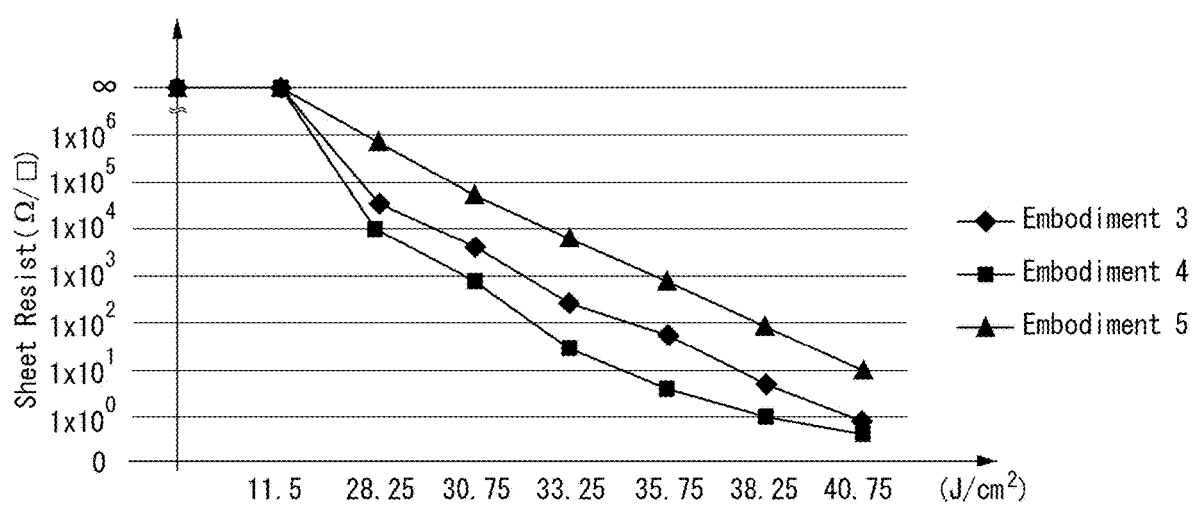
FIG. 10 is a graph showing sheet resistance over an amount of light irradiated to coating films manufactured according to Embodiments 3 through 5 of the present invention.

As shown in Table 3 and FIG. 10, as the content of copper nanowires increases from 0.01 wt % to 1 wt %, the sheet resistance according to an amount of irradiated light decreases.

As described above, the transparent conductive layer including copper nanowires according to an embodiment of the present invention has an increased conductivity and excellent transmittance over an amount of irradiated light. Thus, the transparent conductive layer according to an embodiment of the present invention has reliable characteristics sufficient to be applied to a display device.

Experiment 4: Synthesis of Silver Nanowire

Embodiment 6

Ethylene glycol (5 to 50 ml), silver (Ag) precursor (AgNO₃) and PVP(polyvinylpyrrolidone)(($C_6H_9NO$)x) (molecular weight: 10,000 to 150,000) were put in a three neck distillation flask and dissolved into a solution at a predetermined ratio, and stabilized at high temperatures ranging from 150° C. to 200° C. Copper chloride ($CuCl_2$) and sodium chloride (NaCl) were added at an appropriate ratio. The corresponding state was maintained for a predetermined period of time such that the silver nanowires were sufficiently grown to complete reaction. After the lapse of the predetermined period of time, the silver nanowires were washed with de-ionized (DI) water, ethanol, acetone, and the like, to remove impurities. After the silver nanowires were dispersed in DI water, 3-glycidoxypropyltrimethoxysilane as a silane-based surfactant was mixed therewith and heated at temperatures ranging from 100° C. to 120° C. After the lapse of a predetermined period of time, the reaction was stopped and the nanowires were washed with DI water, ethanol, acetone, and the like, to remove impurities. Concentration was calculated to add ethanol or DI water and dispersed to synthesize silver nanowires.

Figure 11:
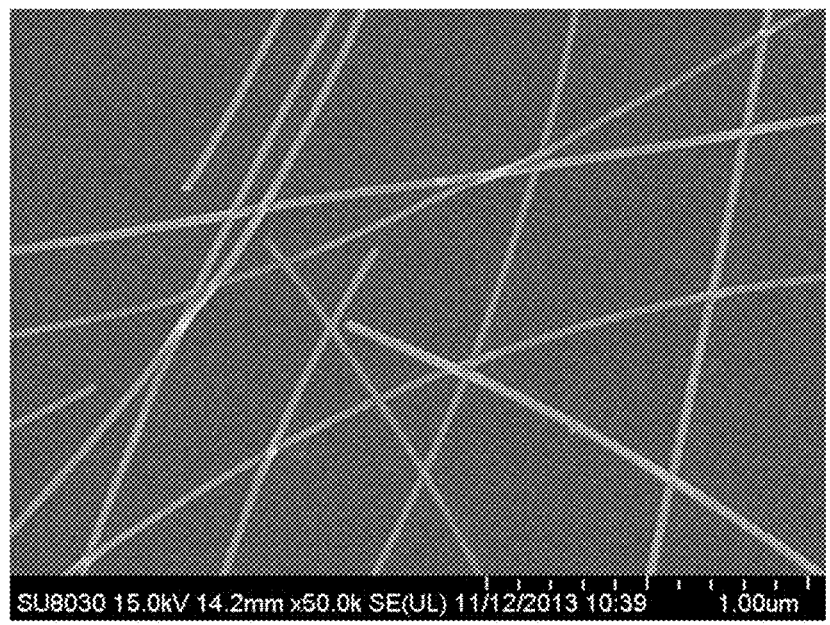
FIG. 11 is a SEM image of nanowires manufactured according to Embodiment 6 of the present invention.

The silver nanowires manufactured according to Embodiment 6 were measured with an SEM as illustrated in FIG. 11. As shown in FIG. 11, the silver nanowires were synthesized.

Experiment 5: Measurement of Sheet Resistance and Transmittance According to Amount of Light Irradiated to Silver Nanowire Coating Film Embodiment 7

The silver nanowire dispersion solution prepared according to Embodiment 6 described above was applied to a substrate to form a coating film.

Light was irradiated to the coating films formed according to Embodiment 7 and Comparative Example 1 described above and sheet resistances were measured according to an amount of irradiated light and shown in the following Table 4 and in FIG. 12, and transmittances were measured according to an amount of irradiated light and shown in the following Table 5 and in FIG. 13. Images of nanowires according to an amount of light irradiated to the coating film formed according to Embodiment 7 are shown in FIGS. 14A through 14C.

TABLE 4

| | Sheet Resistance (Ω/□) | |
|---|---|---|
| Light energy (J/cm²) | Camparative Example 1 | Embodiment 7 |
| 0 | 1843 | ∞ |
| 11.5 | 1843 | ∞ |
| 28.25 | 210 | 2,843 |
| 30.75 | 89 | 34 |
| 33.25 | ∞ | 8 |
| 35.75 | ∞ | 7 |
| 38.25 | ∞ | 6 |
| 40.75 | ∞ | 6 |

TABLE 5

| Light energy (J/cm²) | Transmittance (%) | |
|---|---|---|
| | Comparative Example 1 | Embodiment 7 |
| 0 | 90% | 91% |
| 11.5 | 90% | 92% |
| 28.25 | 83% | 92% |
| 30.75 | 80% | 91% |
| 33.25 | 78% | 91% |
| 35.75 | 79% | 90% |
| 38.25 | 75% | 91% |
| 40.75 | 78% | 89% |

Figure 12:
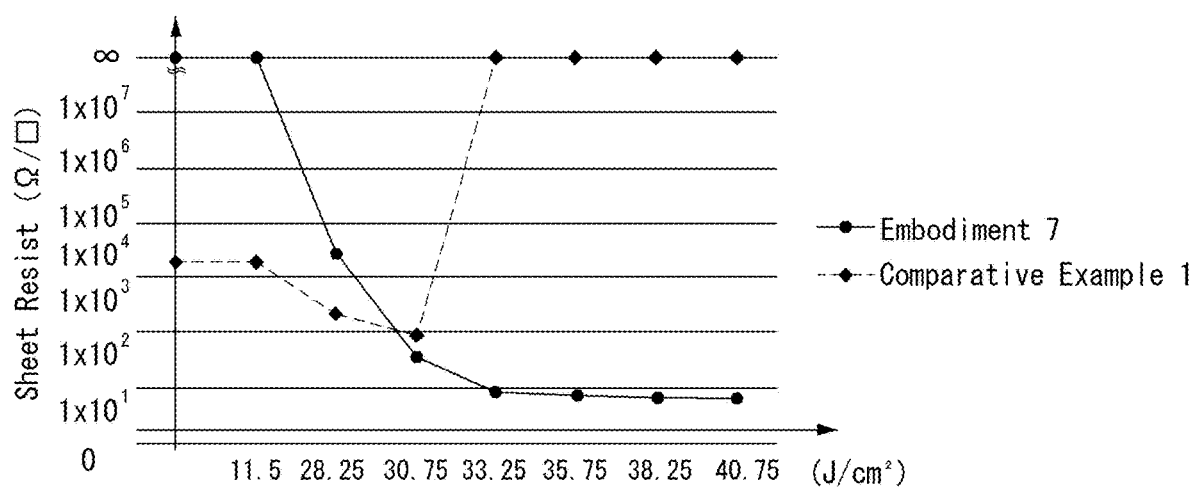
FIG. 12 is a graph showing sheet resistance over an amount of light irradiated to coating films manufactured according to Embodiment 7 and Comparative Example 1 of the present invention.

As shown in Table 4 and FIG. 12, the coating film formed according to Embodiment 7 of the present invention has a sheet resistance that decrease as an amount of light irradiated thereto increases, whereas the coating film formed according to Comparative Example 1 has a sheet resistance that rather increases as an amount of light irradiated thereto increases. Thus, the conductivity of the coating film formed according to Embodiment 7 of the present invention increases as the amount of light irradiated thereto increases.

Figure 13:
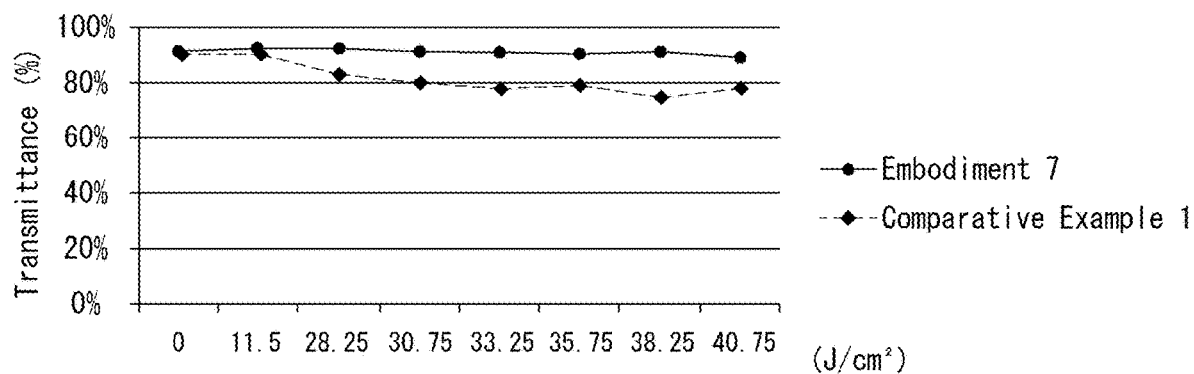
FIG. 13 is a graph showing transmittance over an amount of light irradiated to coating films manufactured according to Embodiment 7 and Comparative Example 1 of the present invention.
Figure 14A:
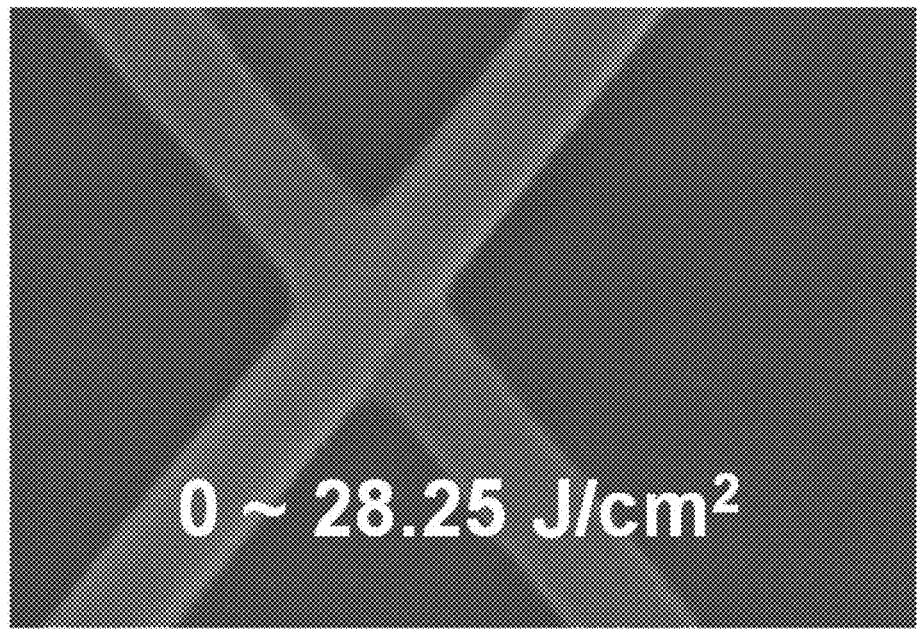
FIGS. 14A through 14C are images of nanowires according to an amount of light irradiated to a coating film manufactured according to Embodiment 7 of the present invention.
Figure 14B:
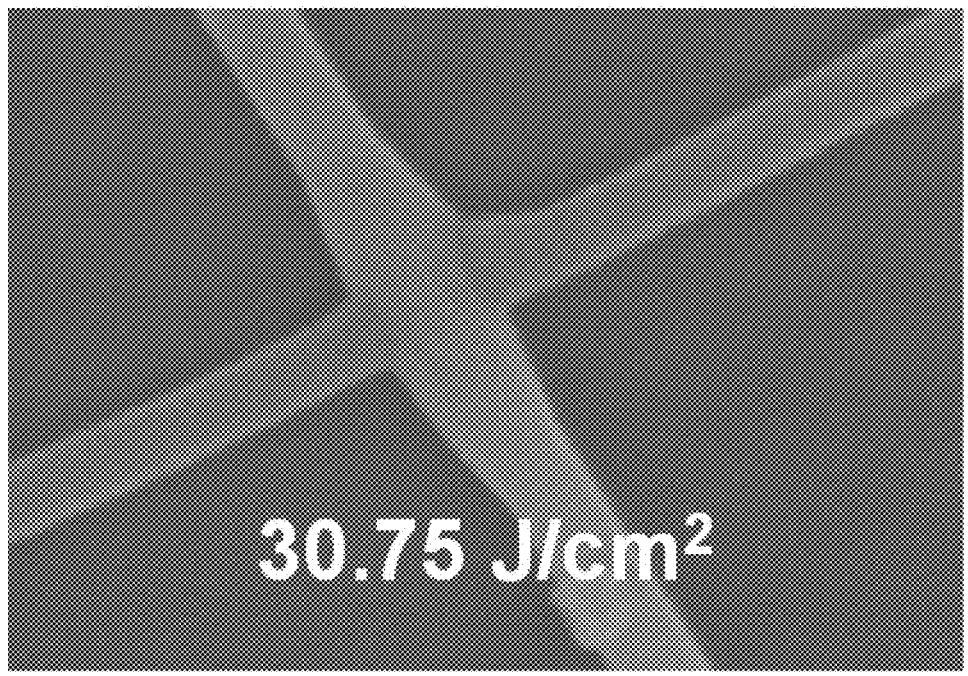
Figure 14C:
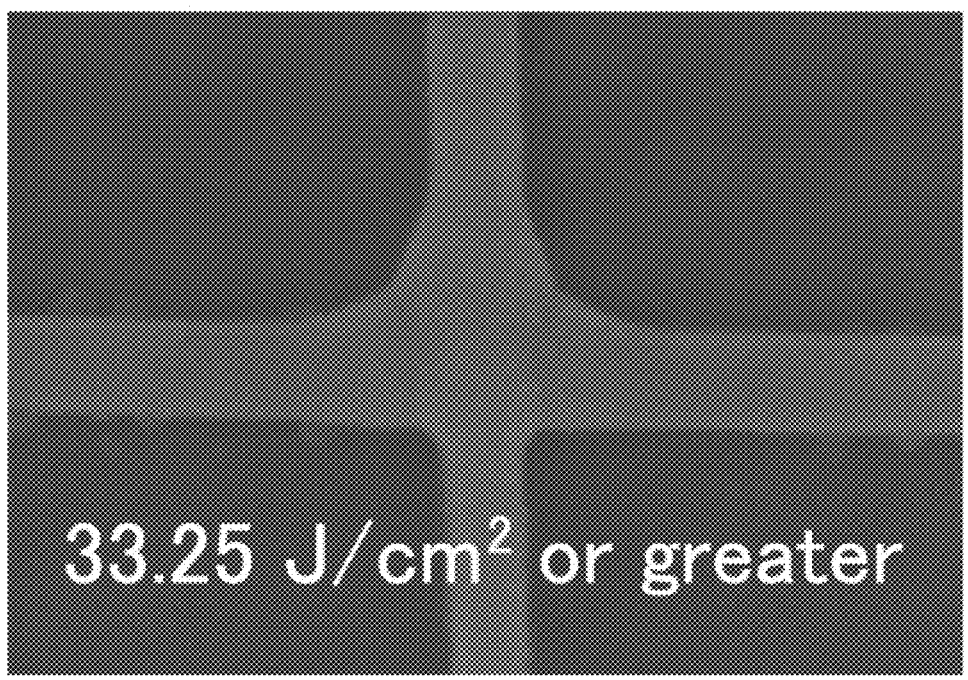

Also, as shown in Table 5 and FIG. 13, the coating film formed according to Embodiment 7 of the present invention has a uniform transmittance, although the amount of light irradiated thereto is increased, whereas the coating film formed according to Comparative Example 1 has a transmittance that is decreased to about 70% when an amount of light irradiated thereto is increased, and the transmittance is then maintained at the level.

Also, as shown in FIGS. 14A through 14C, the nanowires of the coating film manufactured according to Embodiment 7 come into contact when an amount of irradiated light was 30.75 J/cm² and the nanowires were welded and bonded together when an amount of irradiated light was 33.25 J/cm².

Experiment 6: Measurement of Reliability of Silver Manowire at High Temperature

Embodiment 8

The silver nanowires manufactured according to Embodiment 6 was heat-treated for 30 minutes to 180 minutes under a high temperature condition of 200° C.

Comparative Example 2

The silver nanowires manufactured according to Comparative Example 1 described above was heat-treated for 30 minutes under a high temperature condition of 200° C.

Figure 15:
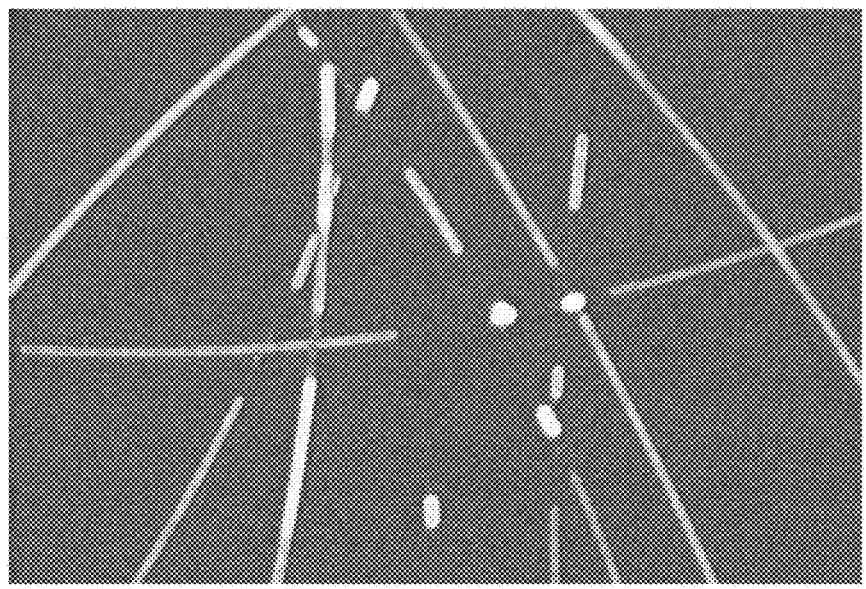
FIG. 15 is a SEM image of silver nanowires according to Comparative 2 in the present invention.
Figure 16A:
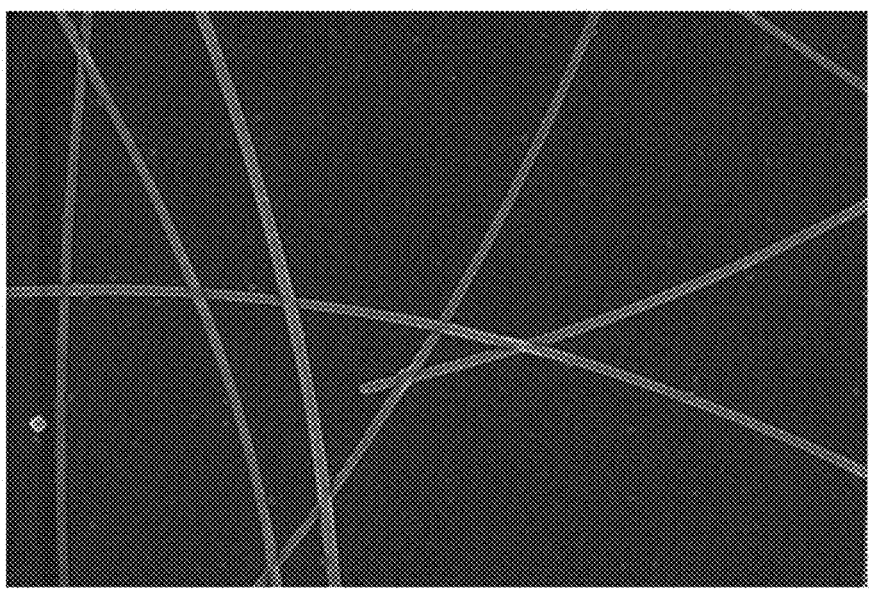
FIGS. 16A and 16B are SEM images of silver nanowires according to Embodiment 8 of the present invention.
Figure 16B:
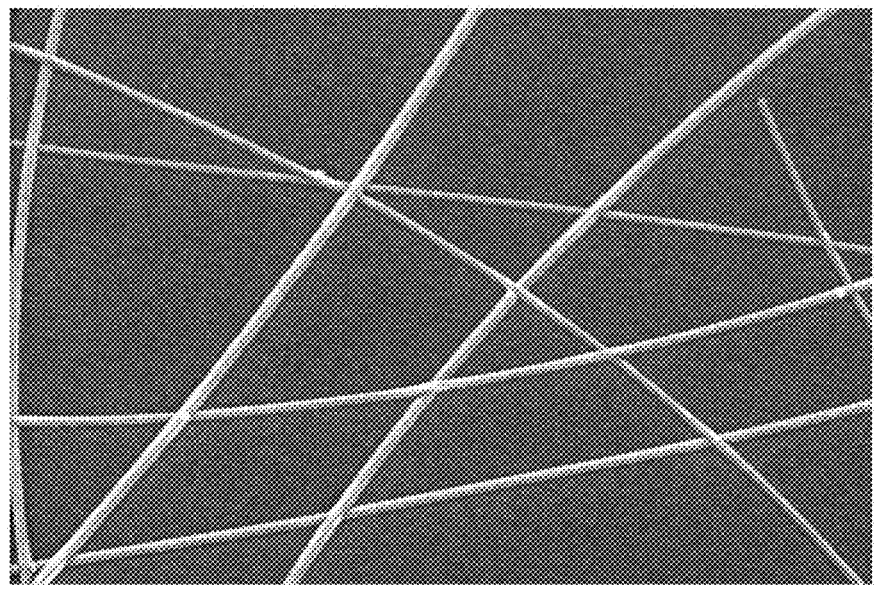

A SEM image of the silver nanowire according to Comparative Example 2 described above is shown in FIG. 15, and a SEM image of a silver nanowire according to Embodiment 8 is shown in FIGS. 16A and 16B.

As shown in FIG. 15, when the silver nanowires according to Comparative Example 2 were heat-treated at a temperature of 200° C. for 30 minutes, the silver nanowires were broken (cut off). In contrast, as shown in FIGS. 16A and 16B, when the silver nanowires according to Embodiment 8 were heat-treated at a temperature of 200° C. for 30 minutes to 180 minutes, the silver nanowires were maintained without being broken (disconnected).

From the foregoing experimental results, it can be seen that the copper nanowires and the silver nanowires according to embodiments of the present invention have excellent sheet resistance and conductivity characteristics, as well as an excellent heat resistance.

Hereinafter, display devices having a transparent conductive layer according to an exemplary embodiment of the present invention will be described.

Figure 17:
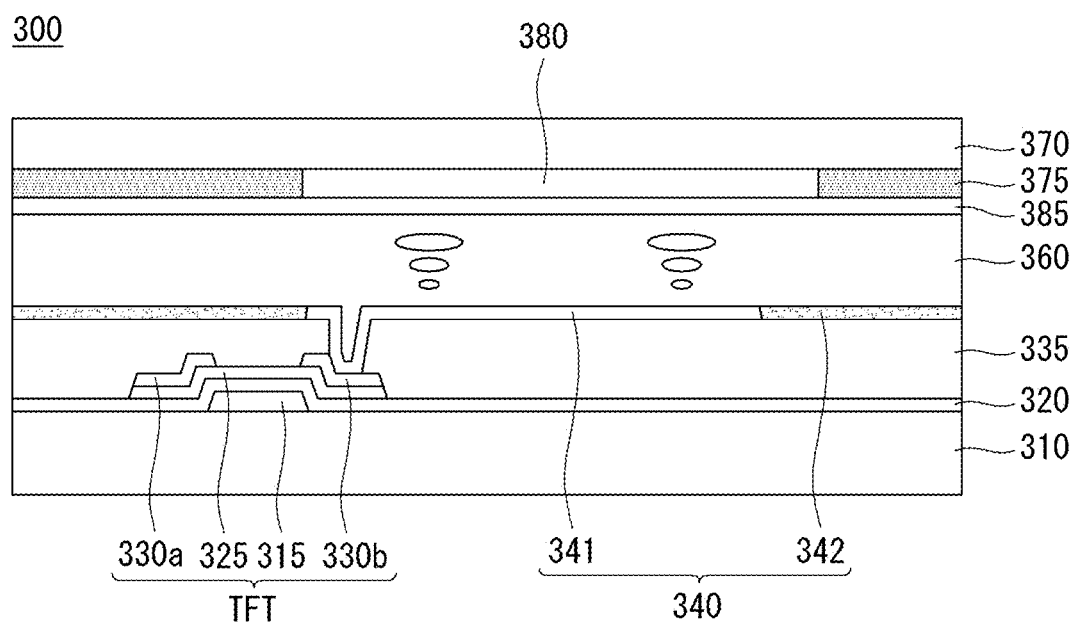
FIG. 17 is a view illustrating a display device according to the first embodiment of the present invention.
Figure 18:
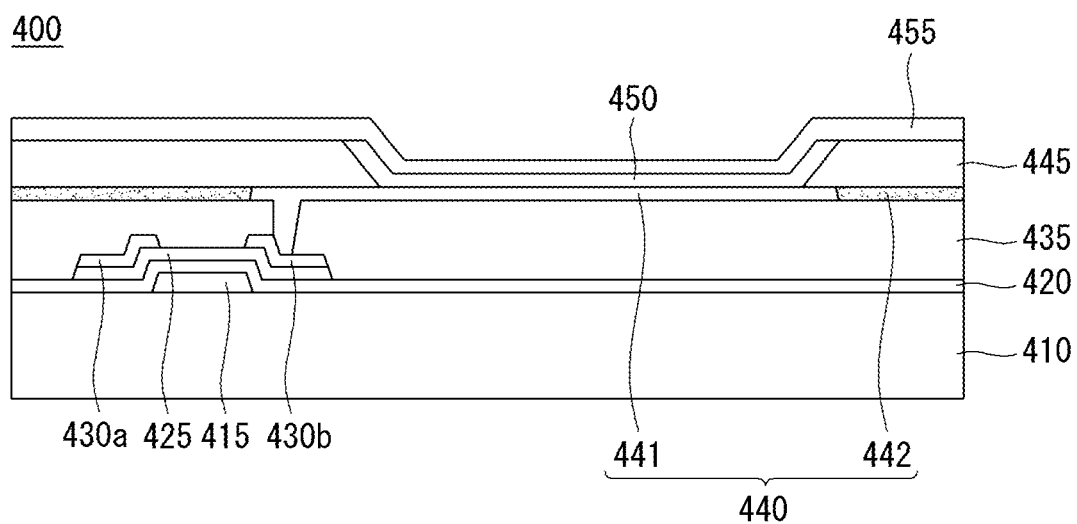
FIG. 18 is a view illustrating a display device according to the second embodiment of the present invention.
Figure 19:
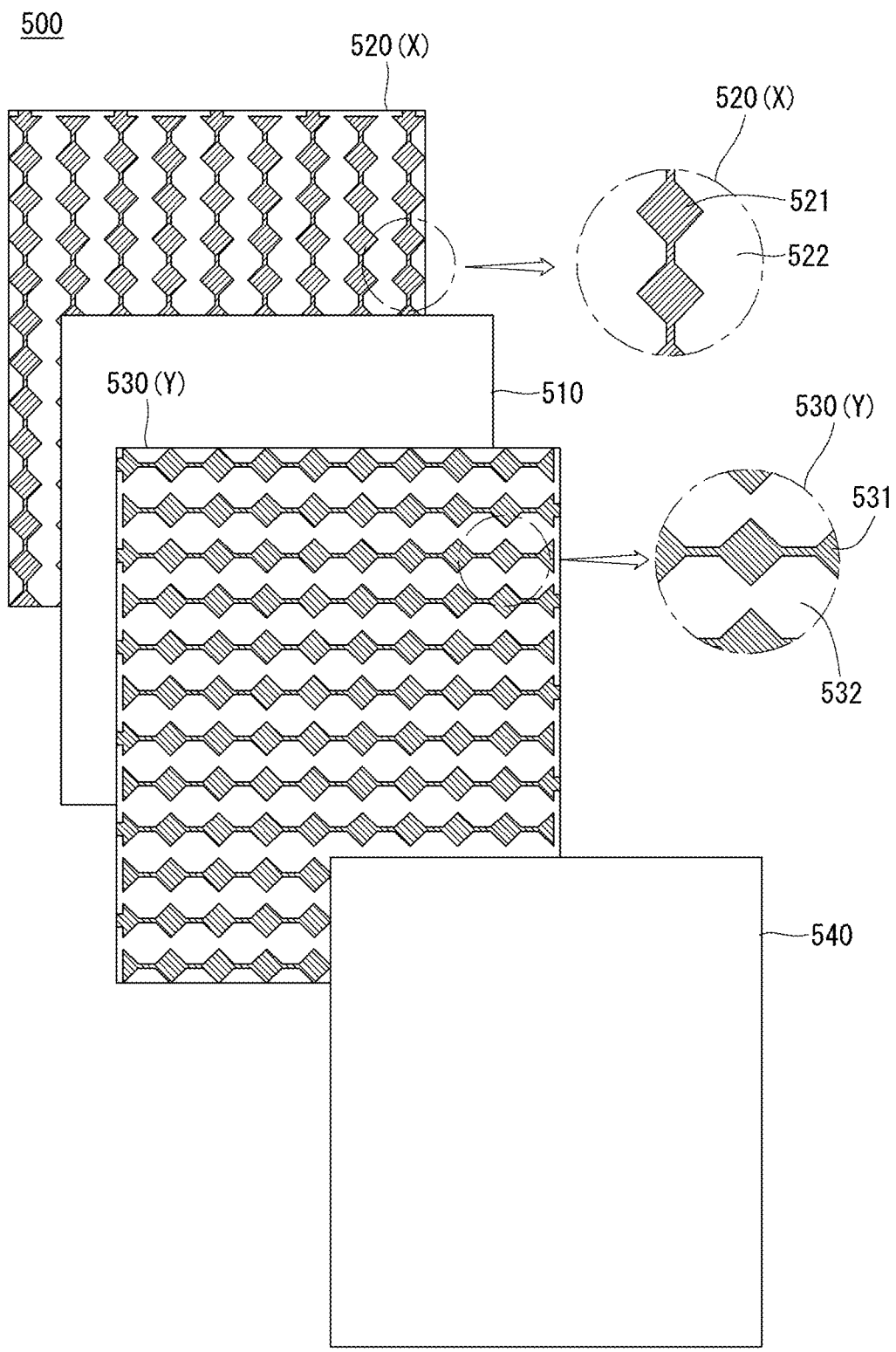
FIG. 19 is a view illustrating a display device according to the third embodiment of the present invention.

FIG. 17 is a view illustrating a display device according to the first embodiment of the present invention, FIG. 18 is a view illustrating a display device according to the second embodiment of the present invention, and FIG. 19 is a view illustrating a display device according to the third embodiment of the present invention.

Referring to FIG. 17, a display device according to the first embodiment of the present invention may be a liquid crystal display (LCD) device 300. The LCD device 300 may include a TFT array substrate 310 and a color filter substrate 370 facing each other with a liquid crystal layer 360 interposed therebetween. The color filter substrate 370 includes a black matrix 375 demarcating each pixel, a color filter 380 formed in a pixel demarcated by the black matrix 375, and a common electrode 385 positioned on the color filter 380. R, G, and B color filters 380 are formed in pixel regions demarcated by the black matrix 375 to realize R, G, and B colors. An overcoat layer may be further provided between the color filter 380 and the common electrode 385.

A gate electrode 315 is positioned on the TFT array substrate 310, and a gate insulating layer 320 is positioned on the gate electrode 315 to insulate the gate electrode 315. A semiconductor layer 325 corresponding to the gate electrode 315 is positioned on the gate insulating layer 320, and a source electrode 330a and a drain electrode 330b are positioned on both sides of the semiconductor layer 325 to form a thin film transistor (TFT). A protective layer 335 is positioned on the TFT, and a pixel electrode 340 connected to the drain electrode 330b is positioned on the protective layer 335. In the LCD device 300 configured as described above, a vertical field is formed between the pixel electrode 340 to which a pixel signal is supplied through the TFT and the common electrode 385 to which a reference voltage is supplied, thus driving liquid crystal. In FIG. 17, a twisted-nematic (TN) LCD device in which the pixel electrode 340 is positioned on the TFT array substrate 310 and the common electrode 385 is positioned on the color filter substrate 370 is illustrated and described, but an IPS mode LCD device in which both a pixel electrode and a common electrode are formed on the TFT array substrate 310 may also be taken as an example.

In the LCD device according to the first embodiment of the present invention, one or more of the pixel electrode 340 and the common electrode 385 may be formed as a transparent conductive layer formed with a nanowire dispersion solution. Thus, the pixel electrode 340 may have a conductive region 341 and a non-conductive region 342, and here, the conductive region 341 serves as an electrode, and the non-conductive region 342 serves as an insulating layer. Also, the common electrode 385 entirely serves as a conductive region. Because a patterning process to form the pixel electrode and the common electrode can be omitted, a damage to the existing structure may be prevented and manufacturing cost may be reduced.

A display device according to the second embodiment of the present invention may be an organic light emitting display device. Referring to FIG. 18, in an organic light emitting display device 400 according to the second embodiment of the present invention, a gate electrode 415 is positioned on a substrate 410, and a gate insulating layer 420 is positioned on the gate electrode 415 in order to insulate the gate electrode 415. A semiconductor layer 425 corresponding to the gate electrode 415 is positioned on the gate insulating layer 420, and a source electrode 430a and a drain electrode 430b are positioned on both sides of the semiconductor layer 425 to form a TFT. A planarization layer 435 is positioned on the TFT, and a pixel electrode 440 connected to the drain electrode 430b is positioned on the planarization layer 435.

A bank layer 445 is positioned on the pixel electrode 440 to expose a portion of the pixel electrode 440. An organic light emitting layer 450 is positioned on the pixel electrode 440 and the bank layer 445. The organic light emitting layer 450, a layer in which electrons and holes are combined to emit light, may include a hole injection layer, a hole transport layer, an electron transport layer, and an electron injection layer. A counter electrode 455 is positioned on the substrate 410 with the organic light emitting layer 450 formed thereon, forming the organic light emitting display device 400 according to the second embodiment of the present invention.

In the organic light emitting display device 400 according to the second embodiment of the present invention described above, the pixel electrode may be formed as a transparent conductive layer manufactured with a nanowire dispersion solution according to an embodiment of the present invention. Thus, the pixel electrode 440 may include a conductive region 441 and a non-conductive region 442, and here, the conductive region 441 serves as an electrode, and the non-conductive region 442 serves as an insulating layer. Thus, in the organic light emitting display device 400 according to the second embodiment of the present invention, since a patterning process to form the pixel electrode can be omitted, a damage to the existing structure may be prevented and manufacturing cost may be reduced.

A display device according to the third embodiment of the present invention may be a touch device. Referring to FIG. 19, in a touch device 500 according to the third embodiment of the present invention, driving electrodes 520 and sensing electrodes 530 are disposed to sandwich a substrate 510, and a protective substrate 540 is positioned to protect these elements, thus forming the touch device 500.

The driving electrodes 520 are connected on a lower surface of the substrate 510 in a first direction. For example, the driving electrodes 520 may be formed to be close to each other in a regular pattern such as a diamond pattern on the lower surface of the substrate 510. The driving electrodes 520 positioned in a column having the same X coordinate are connected to each other to form a plurality of X patterns. The sensing electrodes 530 are formed on the substrate 510 in a second direction, and here, the sensing electrodes 530 are alternately disposed with respect to the driving electrodes 520 so as not to overlap the driving electrodes 520. For example, the sensing electrodes 530 are formed to be close to each other in a diamond pattern, like the driving electrodes 520, and here, the sensing electrodes 530 positioned in a row having the same Y coordinate are connected to each other to form a plurality of Y patterns.

In the touch device 500, when a user's finger or an object comes into contact with an upper portion of the protective substrate 540, a change in capacitance of the driving electrode 520 and the sensing electrode 530 at the contact position is transmitted. As the change in capacitance is electrically converted by a touch recognition processor, or the like, the contact position is recognized and the display device operates.

The driving electrodes 520 and the sensing electrodes 530 are beneficially formed of a transparent conductive material such that the light emitted from an underlying LCD device or organic light emitting display device can transmit therethrough. Thus, one or more of the driving electrodes 520 and the sensing electrodes 530 of the touch device 500 may be formed as a transparent conductive layer manufactured with a nanowire dispersion solution according to an embodiment of the present invention. Thus, each driving electrode 520 may include a conductive region 521 and a non-conductive region 522, and here, the conductive region 521 serves as an electrode, and the non-conductive region 522 serves as an insulating layer. Also, each sensing electrode 530 may include a conductive region 531 and a non-conductive region 532, and here, the conductive region 531 serves as an electrode, and the non-conductive region 532 serves as an insulating layer. As a result, because a patterning process to form one or more of the sensing electrodes and the driving electrodes is omitted, a damage to the existing structure may be prevented and manufacturing cost may be reduced.

As described above, a transparent conductive layer according to an embodiment of the present invention may have a conductive region and a non-conductive region, and electrodes or wirings may be manufactured without performing a patterning process. As a result, a damage to the film due to its patterning process may be prevented, and thus, electrical characteristics of a display device in which the transparent conductive layer is formed may be enhanced, leading to an enhanced display quality.

Also, according to a method for manufacturing a transparent conductive layer according to an embodiment of the present invention, since the patterning process is omitted, the process of manufacturing the transparent conductive layer may be simplified, with may reduce manufacturing cost and enhance productivity.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A display device having a first region and a second region bordering the first region that includes a transparent conductive layer, each of the first and second regions having a plurality of nanowires, each nanowire comprising:
   a core that includes a metal;
   a first shell on the core, the first shell including an oxide of the metal of the core; and
   a second shell on the first shell,
   wherein cores of at least two nanowires in the first region plurality of nanowires are in direct contact with each other as part of the transparent conductive layer,
   wherein cores of at least two nanowires in the second region plurality of nanowires are insulated from each other with the first shell and the second shell therebetween, and
   wherein an area where the cores of the at least two nanowires are in direct contact with each other is an area where the at least two nanowires cross each other and have their first and second shells removed.

2. The display device of claim 1, wherein the metal is Cu or Ag.

3. The display device of claim 1, wherein the second shell includes an organic surfactant.

4. The display device of claim 1, wherein an aspect ratio of the plurality of nanowires ranges from 10 to 10000.

5. The display device of claim 1, wherein the display device is a liquid crystal display (LCD) device that includes a pixel electrode and a common electrode, and wherein one or more of the pixel electrode and the common electrode is formed of the transparent conductive layer.

6. The display device of claim 1, wherein the display device is an organic light emitting display device that includes a pixel electrode, and wherein the pixel electrode is formed of the transparent conductive layer.

7. The display device of claim 1, wherein the display device has a touch device that includes a driving electrode and a sensing electrode, and wherein one or more of the driving electrode and the sensing electrode is formed of the transparent conductive layer.

8. The transparent conductive layer of claim 5, wherein the core is composed of a conductive metal selected from Cu and Ag, and the electrically insulating shell is optionally thermally-insulating, and a second shell composed of an organic surfactant.

9. A display device, comprising the transparent conductive layer of claim 8.

10. The display device of claim 9, wherein the display device is a liquid crystal display (LCD) device that includes a pixel electrode and a common electrode, and wherein one or more of the pixel electrode and the common electrode is formed of the transparent conductive layer.

11. The display device of claim 9, wherein the display device is an organic light emitting display device that includes a pixel electrode, and wherein the pixel electrode is formed of the transparent conductive layer.

12. The display device of claim 9, wherein the display device has a touch device that includes a driving electrode and a sensing electrode, and wherein one or more of the driving electrode and the sensing electrode is formed of the transparent conductive layer.

13. The display device of claim 1, wherein the metal of an oxide of the metal of the first shell is formed of a metal of the core.

14. The display device of claim 3, wherein the organic surfactant is formed one or more selected from including an amine-based surfactant; an acid-based surfactant; a ketone-based surfactant; and a silane-based surfactant having one or more selected from the group having glycidoxypropyltriethoxysilane, 3-glycidoxypropyltrimethoxysilane, N-(2-aminoethyl)-3-aminopropylmethyldimethoxysilane, N-(2-aminoethyl)-3-aminopropyltrimethoxysilane, ($H_2N(CH_2)_2NH(CH_2)_3Si(OCH_3)_3$), N-(2-aminoethyl)-3-aminopropyltriethoxysilane, 3-aminopropyltrimethoxysilane, 3-aminopropyltriethoxysilane, 3-triethoxysili-N-(1,3-dimethylbutylidene)propylamine, N-phenyl-3-aminopropyltrimethoxysilane, 3-mercaptopropylmethyldimethoxysilane, 3-mercaptopropyltriethoxysilane, and 3-isocyanatepropyltriethoxysilane.

* * * * *